(12) United States Patent
Cai et al.

(10) Patent No.: US 9,922,718 B2
(45) Date of Patent: Mar. 20, 2018

(54) FLASH COMMAND THAT REPORTS A COUNT OF CELL PROGRAM FAILURES

(71) Applicant: Seagate Technology LLC, Cupertino, CA (US)

(72) Inventors: Yu Cai, San Jose, CA (US); Yunxiang Wu, Cupertino, CA (US); Erich F. Haratsch, San Jose, CA (US)

(73) Assignee: SEAGATE TECHNOLOGY LLC, Cupertino, CA (US)

( * ) Notice: Subject to any disclaimer, the term of this patent is extended or adjusted under 35 U.S.C. 154(b) by 0 days.

(21) Appl. No.: 14/284,875

(22) Filed: May 22, 2014

(65) Prior Publication Data

US 2015/0340100 A1 Nov. 26, 2015

(51) Int. Cl.
| | | |
|---|---|---|
| *G11C 16/34* | (2006.01) | |
| *G11C 11/56* | (2006.01) | |
| *G11C 16/10* | (2006.01) | |
| *G11C 29/44* | (2006.01) | |
| *G11C 29/52* | (2006.01) | |
| *G06F 11/10* | (2006.01) | |
| *G11C 29/04* | (2006.01) | |

(52) U.S. Cl.
CPC ...... *G11C 16/3459* (2013.01); *G06F 11/1048* (2013.01); *G11C 11/56* (2013.01); *G11C 11/5628* (2013.01); *G11C 16/10* (2013.01); *G11C 16/34* (2013.01); *G11C 29/44* (2013.01); *G11C 29/52* (2013.01); *G11C 16/349* (2013.01); *G11C 2029/0411* (2013.01)

(58) Field of Classification Search
None
See application file for complete search history.

(56) References Cited

U.S. PATENT DOCUMENTS

| 8,086,919 | B2 | 12/2011 | Chen et al. | 714/723 |
|---|---|---|---|---|
| 8,438,356 | B2 | 5/2013 | Yoon et al. | 711/167 |
| 8,627,158 | B2 | 1/2014 | Cadigan et al. | 714/723 |
| 2009/0020608 | A1* | 1/2009 | Bennett | G06F 13/387 |
| | | | | 235/441 |
| 2009/0249148 | A1* | 10/2009 | Ito | G06F 11/2215 |
| | | | | 714/746 |
| 2011/0041005 | A1 | 2/2011 | Selinger | 714/6 |
| 2012/0278819 | A1 | 11/2012 | Cho | 719/325 |
| 2013/0275818 | A1* | 10/2013 | Okubo | G06F 11/167 |
| | | | | 714/54 |
| 2013/0279264 | A1 | 10/2013 | Kim | 365/185.22 |
| 2013/0322171 | A1 | 12/2013 | Lee et al. | 365/185.03 |
| 2014/0119108 | A1 | 5/2014 | Lee | 365/158 |

(Continued)

*Primary Examiner* — Douglas King

(74) *Attorney, Agent, or Firm* — Christopher P. Maiorana, PC

(57) ABSTRACT

An apparatus comprising a memory and a controller. The memory may be configured to process a plurality of read/program operations. The memory may comprise a plurality of memory units. The memory units may each have a size less than a total size of the memory. The memory units may include a plurality of cells. The controller may be configured to issue a plurality of program operations to write to one or more of the cells. The controller may be configured to implement a polling status command after each of the program operations to verify programming of each of the cells. A response to each of the polling status commands may be used to report a number of the cells that failed to be programmed.

20 Claims, 8 Drawing Sheets

(56) References Cited

U.S. PATENT DOCUMENTS

2014/0181456 A1* 6/2014 Kwean ................... G11C 29/88
711/202
2014/0351486 A1* 11/2014 Baryudin .............. G06F 3/0619
711/103

* cited by examiner

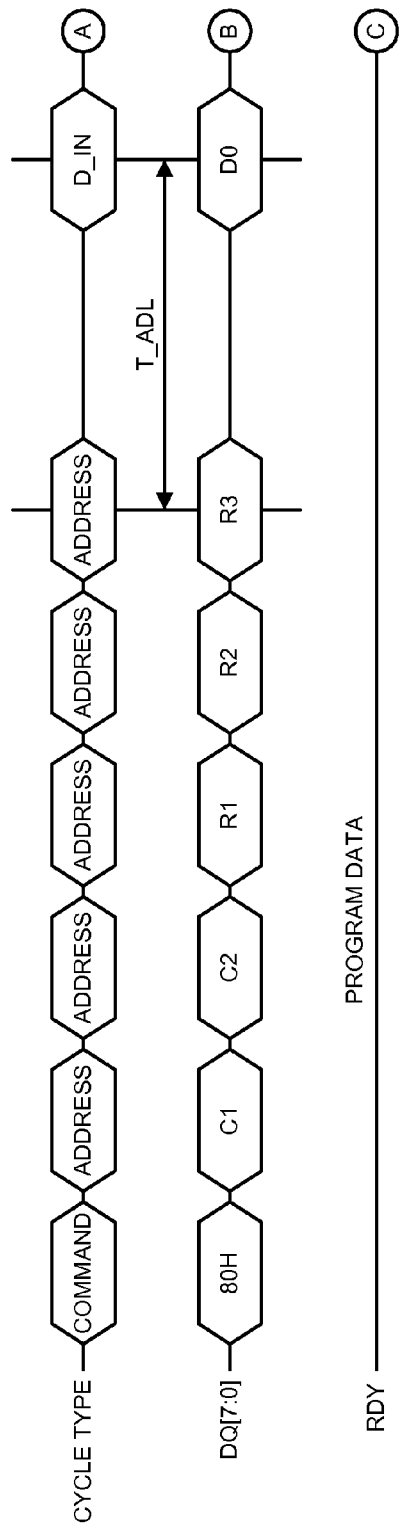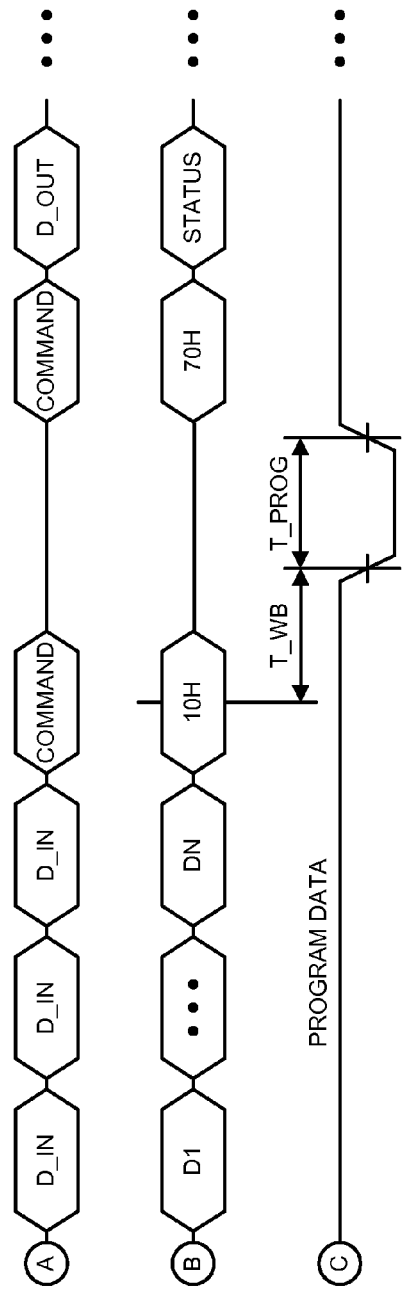
FIG. 2A
FIG. 2B

US 9,922,718 B2

FLASH COMMAND THAT REPORTS A COUNT OF CELL PROGRAM FAILURES

FIELD OF THE INVENTION

The invention relates to data storage generally and, more particularly, to a method and/or apparatus for implementing a flash command that reports a count of cell program failures.

BACKGROUND

Conventional flash memory devices define various commands and types of status commands reported to a flash controller. Flash memory vendors determine market trends. Flash memory vendors do not typically design controllers and lack a complete view of flash controllers. Some potentially useful commands are needed that flash memory vendors have not considered. A flash controller vendor can define necessary and useful commands that can help to improve system performance. The flash memory provides basic information on things such as whether a program operation has failed or not failed. In conventional approaches, flash memory has been relatively reliable. Even a one bit program failure was considered unacceptable and reported as a program failure. Such controllers increase the cost by not using memory that is usable, but has errors. Flash controllers implementing error correction code (ECC) decoding are more aggressive and can correct multiple errors per codeword. Improving bit error correction capability will be more and more necessary as the density of flash memory is increased due to a further scaled down cell size. A simple reporting of a program failure if just one or two bits fail to be programmed does not provide adequate information to a flash controller to be efficient.

It would be desirable to implement a flash command that reports a count of the total number of cell program failures and/or a count of the number of cell program failures on a per chunk basis.

SUMMARY

The invention concerns an apparatus comprising a memory and a controller. The memory may be configured to process a plurality of read/program operations. The memory may comprise a plurality of memory units. The memory units may each have a size less than a total size of the memory. The memory units may include a plurality of cells. The controller may be configured to issue a plurality of program operations to write to one or more of the cells. The controller may be configured to implement a polling status command after each of the program operations to verify programming of each of the cells. A response to each of the polling status commands may be used to report a number of the cells that failed to be programmed.

BRIEF DESCRIPTION OF THE FIGURES

Embodiments of the invention will be apparent from the following detailed description and the appended claims and drawings in which:

FIGS. 2A-2B are diagrams illustrating an example program command.

DETAILED DESCRIPTION OF THE EMBODIMENTS

Embodiments of the invention include providing a flash command that reports a count of cell program failures that may (i) implement a polling status command to verify cell programming, (ii) report a total number of cells that failed programming, (iii) provide error reporting on a per chunk basis, (iv) leverage information traditionally available in flash memory, (v) determine the number of errors without triggering a read operation, (vi) reprogram data to known reliable locations if the number of errors is above a threshold, (vii) tolerate errors if the number of errors is below a threshold, (viii) report a total number of cells that failed programming as a chunk of cells, and/or (ix) be implemented as one or more integrated circuits.

Flash memory modules generally provide information on whether a program operation has failed or did not fail. Basic information on whether the program operation failed or did not fail may be acceptable when the flash memory has high target reliability. With flash memory having high reliability, a one or two bit correction Hamming code may be applied. In a high target reliability configuration without further error correction, even a one bit program failure would be unacceptable and a status report indicating a program failure would provide sufficient information to a flash controller. For example, with a Hamming code-based Solid State Drive (SSD) controller, if the flash memory reports a program failure (e.g., a one bit failure), the existing program operation would be discarded and the data could be programmed to other reliable locations.

A flash controller (e.g., an SSD controller) may implement ECC capable of correcting multiple errors per codeword. ECC may correct errors in less reliable flash memory. For example, a 40-bit error correction capability per 1 k byte ECCs may be implemented for a 20 nm MLC NAND flash memory. As flash memory is scaled down, more errors are expected, and more bit error correction capability is generally needed. Since ECC is capable of correcting multiple errors per codeword, a basic report of a program failure based on one or two bits that fail to be programmed may not provide sufficient information to a SSD controller. For example, a SSD controller may be able to tolerate more than one or two bits (e.g., cells) that fail to be programmed if the number of bits having errors were below a correctable amount.

Figure 1:
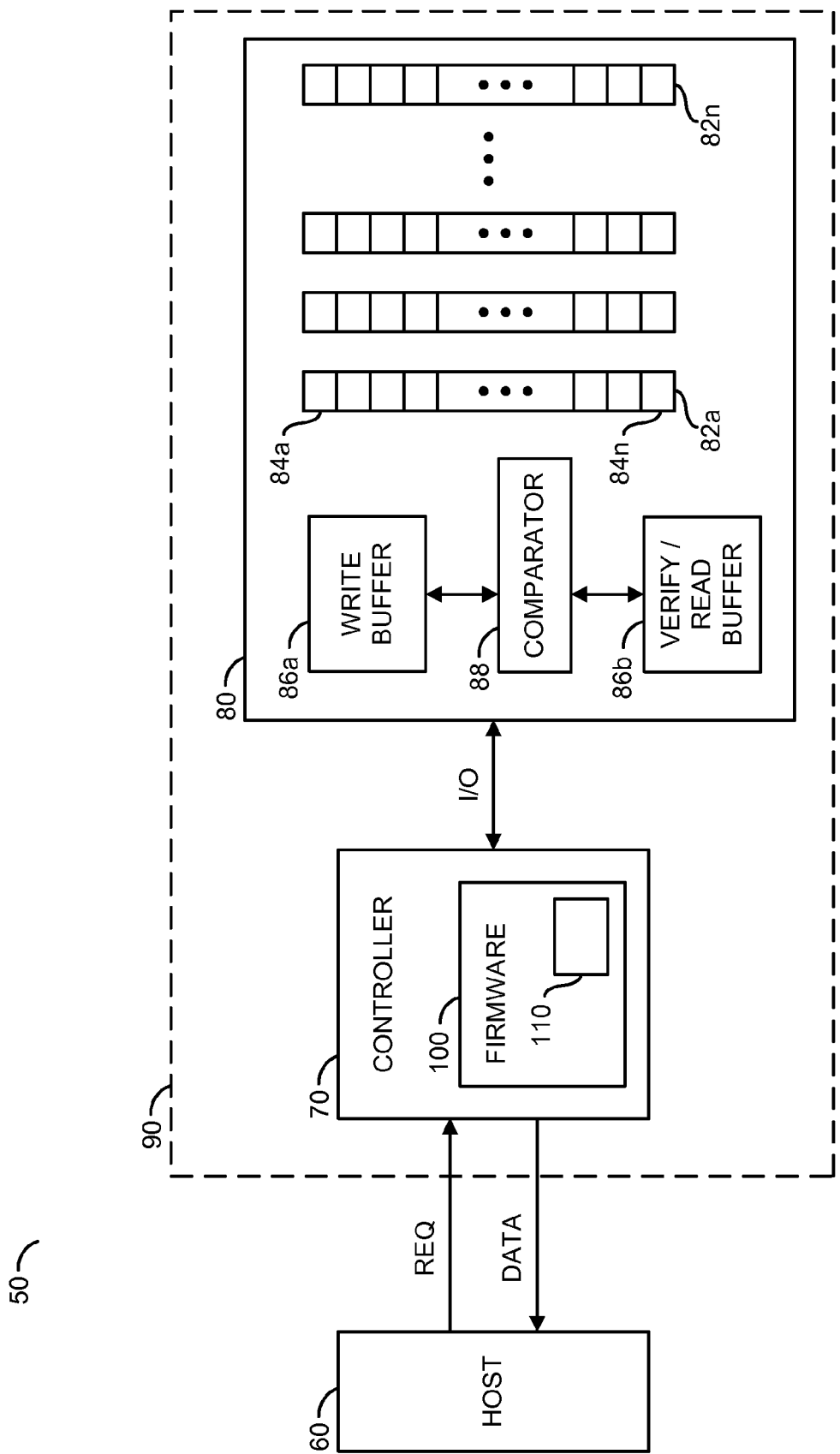
FIG. 1 is a diagram illustrating an example embodiment.

Referring to FIG. 1, a block diagram of an example apparatus 50 is shown. The apparatus 50 generally comprises a block (or circuit) 60, a block (or circuit) 70 and a block (or circuit) 80. The circuit 70 may include a circuit 100. The circuit 100 may be a memory/processor configured to store computer instructions (or firmware) or may be logic. The instructions, when executed, may perform a number of steps. The firmware 100 may include a redundancy control module 110. The redundancy control module 110 may be implemented as part of the firmware 100 or as a separate module. While an example of redundancy implemented in the firmware 100 is shown, the redundancy may be implemented, in another example, in hardware (e.g., logic such as a state machine).

A signal (e.g., REQ) may be generated by the circuit 60. The signal REQ may be received by the circuit 70. The signal REQ may be a request signal that may be used to access data from the circuit 80. A signal (e.g., I/O) may be generated by the circuit 70 to be presented to/from the circuit 80. The signal REQ may include one or more address bits. A signal (e.g., DATA) may be one or more data portions received by the circuit 60.

The circuit 60 is shown implemented as a host circuit. The circuit 70 reads and writes data to and from the circuit 80. The circuit 80 is generally implemented as a nonvolatile memory circuit. The circuit 80 may include a write buffer 86a, a verify/read buffer 86b, a comparator 88, and a number of modules 82a-82n. The modules 82a-82n may be implemented as NAND flash chips. In some embodiments, the circuit 80 may be a NAND flash device. In other embodiments, the circuit 70 and/or the circuit 80 may be implemented as all or a portion of a solid state drive 90 having one or more nonvolatile devices. The circuit 80 is generally operational to store data in a nonvolatile condition. When data is read from the circuit 80, the circuit 70 may access a set of data (e.g., multiple bits) identified in the signal REQ. The signal REQ may request data from the drive 90 or from one of a number of additional storage devices.

Data within the circuit 80 is generally organized in a hierarchy of units, such as die, plane, block, and/or page units. The units may be comprised of cells. The circuit 80 may contain multiple dies (e.g., in a single package or multiple packages). Generally, for enterprise applications the circuit 80 may be comprised of hundreds of flash memory dies. Flash memory may have multiple planes in the same die. The planes may be accessed in parallel to improve performance.

A first type of redundancy may be implemented as a redundancy block. A redundancy block is a combination of blocks (e.g., a block from each nonvolatile memory die in the circuit 80) that can be combined to form a redundant array of silicon independent elements, similar to a redundant array of independent disks for magnetic media. The nonvolatile memory locations within the blocks may be written in a striped fashion. In some embodiments, organizing a plurality of blocks in redundancy blocks reduces an overhead of block management. A block is generally considered a smallest quantum of erasing. A page is generally considered a smallest quantum of writing. A read unit (or codeword or Epage or ECC-page) is a smallest correctable quantum of reading and/or error correction. Each block includes an integer number of pages. Each page includes an integer number of read units.

In some embodiments, the circuit 80 may be implemented as a single-level cell (e.g., SLC) type circuit. A SLC type circuit generally stores a single bit per memory cell (e.g., a logical 0 or 1). In other embodiments, the circuit 80 may be implemented as a multi-level cell (e.g., MLC) type circuit. A MLC type circuit is generally capable of storing multiple (e.g., two) bits per memory cell (e.g., logical 00, 01, 10 or 11). In still other embodiments, the circuit 80 may implement a triple-level cell (e.g., TLC) type circuit. A TLC circuit may be able to store multiple (e.g., three) bits per memory cell (e.g., a logical 000, 001, 010, 011, 100, 101, 110 or 111). In yet another embodiment, the circuit 80 may implement a circuit with a cell level greater than a triple-level cell. Generally, the circuit 80 may be implemented as an n-level cell capable of storing n-bits per memory cell.

In general, the controller 70 may include an erase/program unit that may implement redundancy across the modules 82a-82n. For example, multiple blocks may be read from multiple dies 82a-82n. The erase/program unit may be implemented as part of the firmware (or logic) 100.

The drive 90 may contain, in one example, multiple NAND Flash or memory modules 82a-82n. Each of the memory modules 82a-82n may be fabricated as one or more dies (e.g., 1, 2, 4, 8, etc.). The dies (or modules) 82a-82n may operate to read or to write concurrently. The read and write bandwidth depends on how many of the dies 82a-82n are implemented, as well as the bandwidth of each of the dies 82a-82n. Each of the dies 82a-82n may contain a plurality of planes. Each of the planes of the dies 82a-82n may contain a plurality of blocks 84a-84n. The blocks 84a-84n of the planes of one of the dies 82a-82n may be accessed in parallel. If the SSD 90 receives the host command REQ, in order to achieve the best performance, and/or to address wear leveling issues, the drive 90 will walk through all of the dies 82a-82n (e.g., a first page of DIE0, DIE1 . . . DIEn, then a next page of DIE0).

The write buffer 86a may buffer error free data to be programmed to the circuit 80. For example, the signal I/O may present data from the controller 70 to the circuit 80. The data in the signal I/O may be stored in the write buffer 86a. Data stored in the write buffer 86a may be programmed to the memory units (e.g., the memory modules 82a-82n, and/or the memory blocks 84a-84n). Data stored in the write buffer 86a may be stored temporarily (e.g., until the data is programmed to the cells in the memory 80 and/or until the program operation success is verified).

The verify/read buffer 86b may store read out data (e.g., verify data). The read out data stored in the verify/read buffer 86b may be used to verify the success of a program operation. For example, the verify/read buffer 86b may be configured to read cells during a verify stage of incremental step pulse programming (ISPP).

The comparator 88 may be configured to compare values presented by the write buffer 86a and the verify/read buffer 86b. For example, the comparator 88 may compare values from the write buffer 86a and the verify/read buffer 86b bit by bit. A bit by bit comparison may determine the location and/or number of cells that have program errors/failures.

The arrangement and interconnections of the write buffer 86a, the verify/read buffer 86b, and the comparator 88 may be varied according to the design criteria of a particular implementation. For example, in some embodiments, the memory 80 may be comprised of the write buffer 86a, the verify/read buffer 86b, and/or the comparator 88. In another example, the memory 80 may be comprised of only a single buffer (e.g., the write buffer 86a). In yet another example, other buffers and/or comparison circuits may be implemented. A number of cells that have programming errors/failures may be determined based on the arrangement of circuits in the memory 80.

Referring to FIGS. 2A-2B, a diagram illustrating an example program command is shown. Various cycle types are shown. The cycle types may be varied according to the design criteria of a particular implementation. Generally, the controller 70 may issue a program command (e.g., 80H). The program command may be issued to the flash memory 80. After programming data to the flash memory 80, the controller 70 may verify the program operation. In conventional SSD controllers, the program verify may be implemented by issuing a read status command (e.g., 70H) to the flash memory 80 to report a programming failure. In conventional SSD controllers, a program failure may be reported if any of the cells are not successfully programmed. However, additional errors may be tolerated.

Flash memory cells are programmed with ISPP. ISPP generally comprises two stages. A program stage may increase a threshold voltage by ΔV of the cells that are programmed. The verify stage may read the programmed cells to determine whether the threshold voltage is larger than a target threshold voltage. For example, the verify/read buffer 86b may read the programmed cells. If the threshold voltage is larger than the target threshold voltage, ISPP may terminate programming. If the threshold voltage is less than the target threshold voltage, ISPP may repeat iterations of the program stage and/or the verify stage. Iterations may be repeated until a maximum number of such iterations (e.g., a loop count) has been reached, and/or until the ISPP terminates because all of the cells are correctly programmed.

In a conventional SSD, if the flash memory 80 reaches the maximum program/verify loop count, the flash memory 80 may determine whether all of the cells have reached the target threshold voltage range. In a conventional SSD, if all the cells reach the target threshold voltage range, the flash memory 80 may report programming success after the read status command (e.g., 70H). In a conventional SSD, if all of the cells do not reach the target threshold voltage range, the flash memory 80 may report a program failure after the read status command.

The controller 70 may be configured to perform a polling status command. The polling status command may be performed instead of the read status command. The polling status command may report to the controller 70 a number of bits and/or cells that failed to be programmed. If the bit and/or cell failure count is less than a tolerable amount, the controller 70 may tolerate the errors and/or programming failures. The polling status command may request a report from the flash memory 80 to indicate the number of cells that failed to be programmed.

Figure 3:
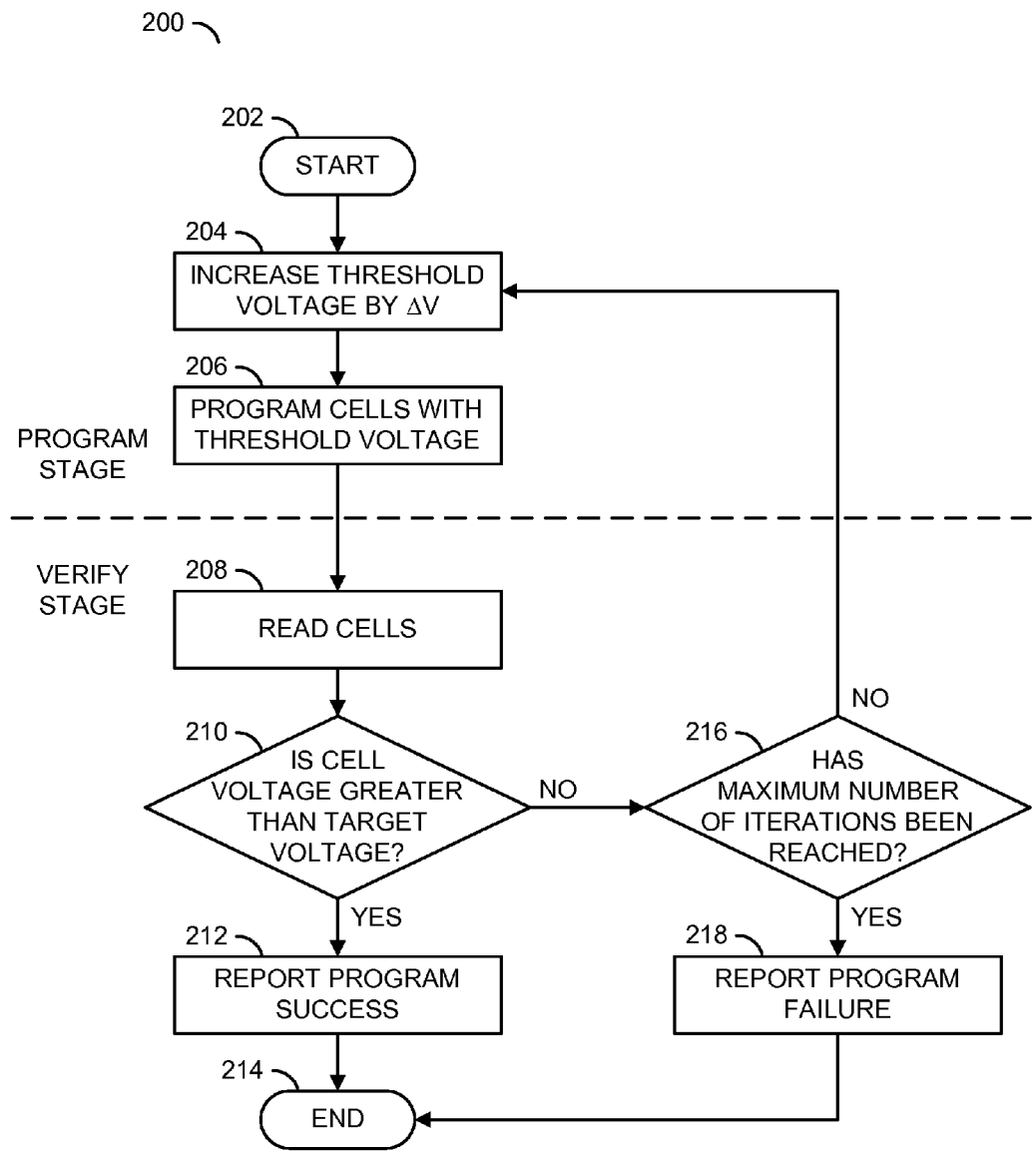
FIG. 3 is a flow diagram illustrating incremental step pulse programming.

Referring to FIG. 3, a flow diagram illustrating a method (or process) 200 is shown. The method 200 may implement incremental step pulse programming. The method 200 generally comprises a step (or state) 202, a step (or state) 204, a step (or state) 206, a step (or state) 208, a decision step (or state) 210, a step (or state) 212, a step (or state) 214, a decision step (or state) 216, and a step (or state) 218. The steps 204 and/or 206 may be the program stage. The steps 208, 210, 212, 216 and/or 218 may be the verify stage.

The state 202 may be a start state. The state 204 may increase the threshold voltage by a value ΔV. The state 206 may program a number of cells with the threshold voltage. The state 208 may read one or more cells. The decision state 210 may determine whether a cell has a voltage greater than a target voltage. If so, the method 200 moves to the state 212. The state 212 may report a program success. Next, the method 200 moves to the state 214, which ends the method 200.

If the decision state 210 determines a cell does not have a voltage greater than a target voltage, the method 200 moves to the decision state 216. The decision state 216 may determine if a maximum number of iterations has been reached. If so, the method 200 moves to the state 218. If not, the method 200 moves back to the state 204. The state 218 reports a program failure. Next, the method 200 ends at the state 214.

Figure 4:
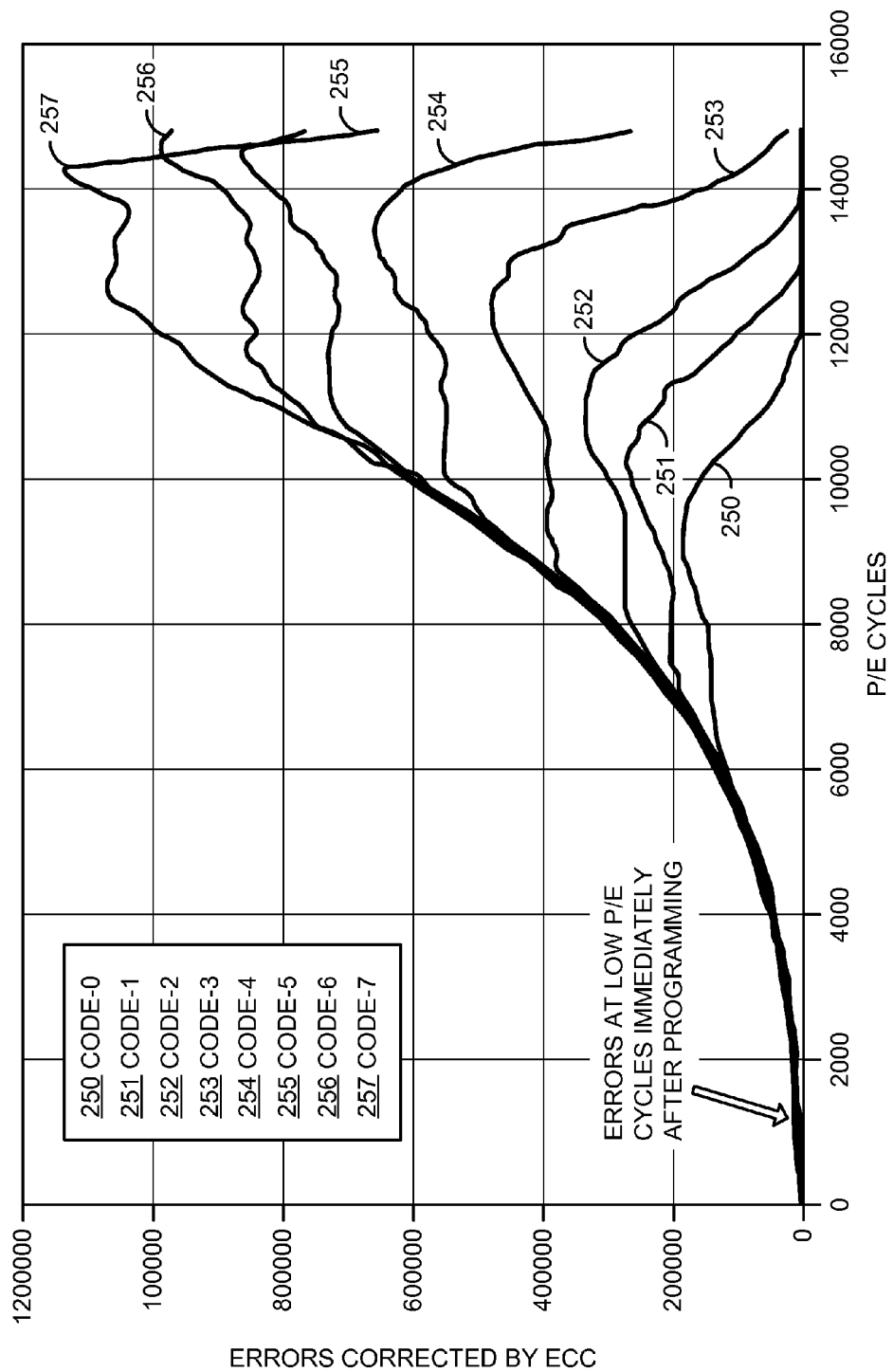
FIG. 4 is a diagram of a graph illustrating errors corrected by ECC versus program/erase cycles.

Referring to FIG. 4, a diagram of a graph illustrating errors corrected by ECC versus program/erase cycles is shown. Current NAND flash memory (e.g., the memory 80) may show failures after programming even at low P/E cycles. For example, the errors corrected by the ECC codes shown in FIG. 4 indicate errors at low P/E cycles. The conventional read status command may indicate programming failure at low P/E cycles. However, since the ECC codes shown in FIG. 4 may be capable of correcting the errors, the number of errors may be tolerable. When the number of errors is tolerable, the conventional read status command may not provide useful information. For example, the conventional read status command may report a programming failure even when the number of errors is tolerable. The information provided by the conventional read status command may be unnecessary and/or have little or no value.

Generally, detailed information regarding the number of cells that failed programming is useful. To determine the number of cells that failed programming, the conventional SSD controller may read a complete page and compare the read data with the known programmed data. Performing additional read operations may significantly degrade the performance of the SSD 90.

The polling status command may be implemented by the controller 70. The polling status command may report the number of errors (e.g., the number of cells that failed after a programming operation) without performing an additional read operation. For example, the comparator 88 may provide the number of errors by performing a bit by bit comparison of data stored in the write buffer 86a and the verify/read buffer 86b. The polling status command may leverage information available from the flash memory 80. The polling status command may increase the performance of the SSD 90. Based on the number of errors reported by the polling status command, the controller 70 may take further steps to ensure integrity of the data.

Figure 5:
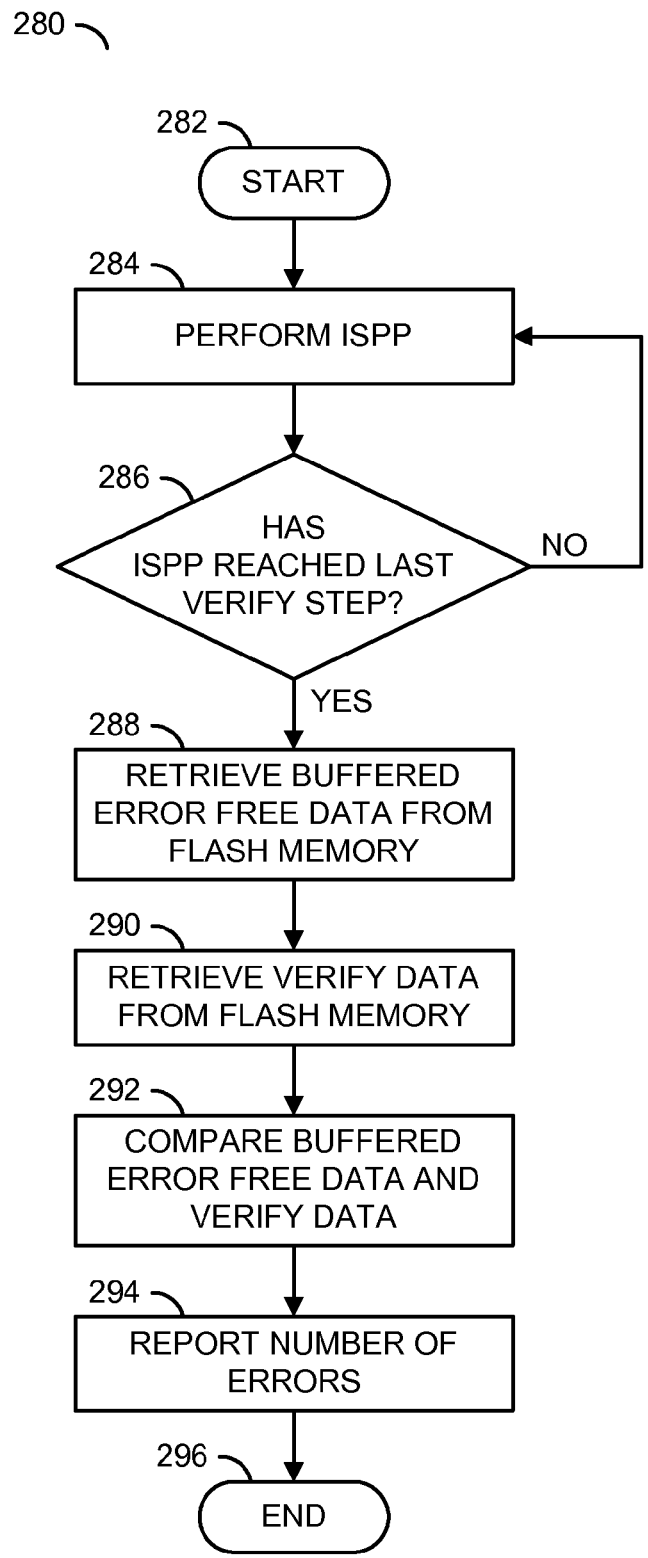
FIG. 5 is a flow diagram illustrating reporting a number of cells that fail programming.

Referring to FIG. 5, a flow diagram illustrating a method (or process) 280 is shown. The method 280 may implement reporting a number of cells that fail programming. The method 280 generally comprises a step (or state) 282, a step (or state) 284, a decision step (or state) 286, a step (or state) 288, a step (or state) 290, a step (or state) 292, a step (or state) 294, and a step (or state) 296.

The state 282 may be a start state. The state 284 may perform ISPP. Next, the decision state 286 determines if ISPP has reached the last verify step. If not, the method moves back to the state 284. If so, the method 280 moves to the state 288. The state 288 retrieves buffered error free data from the flash memory 80 (e.g., data stored in the write buffer 86a). Next, the state 290 retrieves verify data from the flash memory 80 (e.g., data stored in the verify/read buffer 86b). Next, the state 292 compares the buffered error free data to the verify data (e.g., a bit by bit comparison performed by the comparator 88). Next, the state 294 reports the number of errors from the compare step 292. The state 296 ends the method 280.

In response to the status polling command, the flash memory 80 may report the number of cells that failed programming (e.g., the number of errors). ISPP may be implemented to program/verify the flash cells of the flash memory 80. The flash memory 80 may store buffered, error free data in the write buffer 86a to be programmed in the flash memory cells. The flash memory may have read out data (e.g., verify data) stored in the verify/read buffer 86b after programming.

In the last verify steps of ISPP, the comparator 88 may compare the verify/read data stored in the verify/read buffer 86b to the buffered data (e.g., the data to be programmed) stored in the write buffer 86a (e.g., a bit by bit comparison).

The comparison performed by the flash memory 80 may determine the number of cells that failed to be programmed. Generally, flash memory is already configured to read/verify data and/or buffer error free data that needs to be programmed. The controller 70 implementing the status polling command may leverage functionality in the flash memory 80 to determine whether or not the program operation may be considered successful or unsuccessful.

Figure 6:
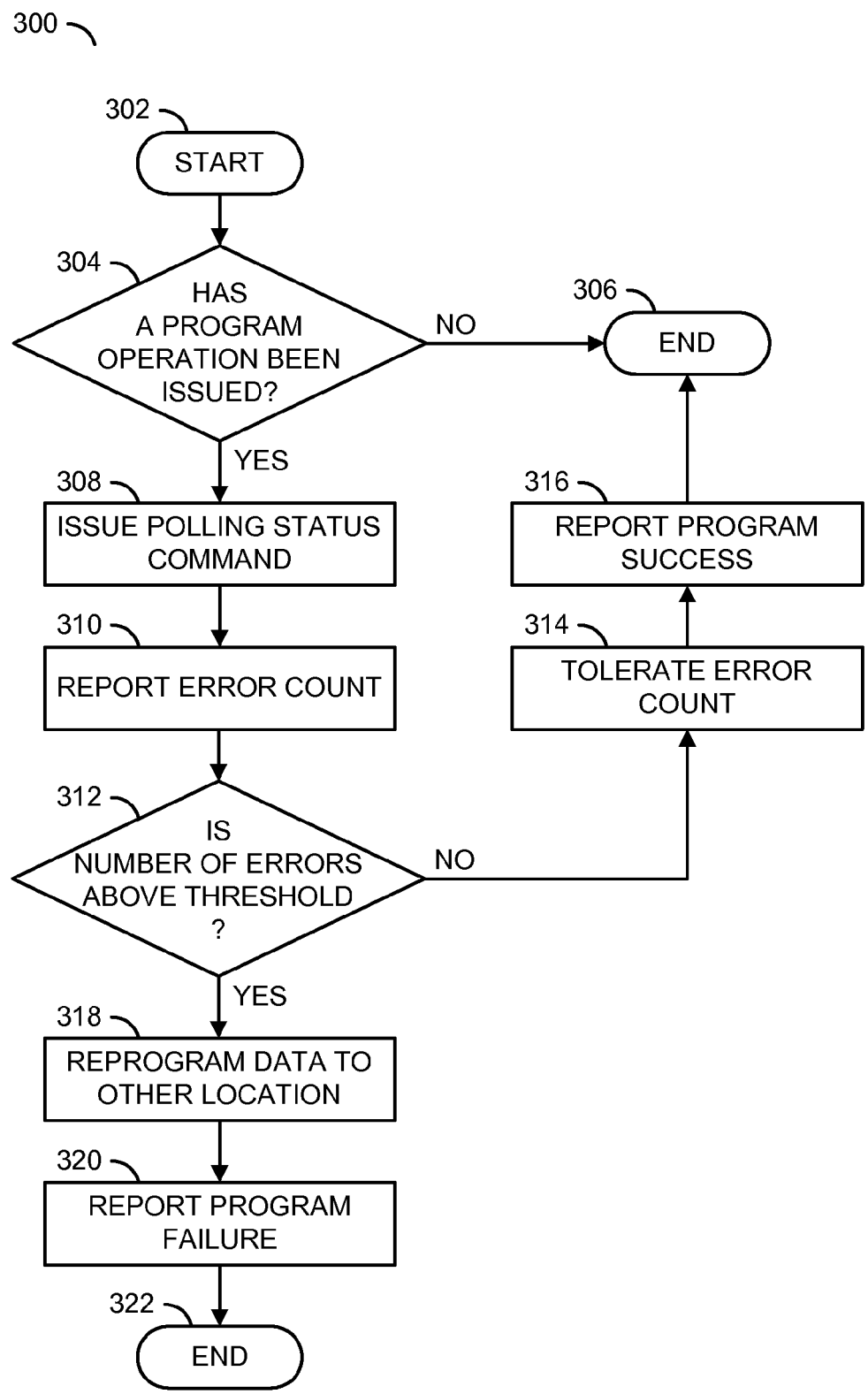
FIG. 6 is a flow diagram illustrating a decision based on a reported error count.

Referring to FIG. 6, a flow diagram illustrating a method (or process) 300 is shown. The method 300 may implement a decision based on a reported error count. The method 300 generally comprises a step (or state) 302, a decision step (or state) 304, a step (or state) 306, a step (or state) 308, a step (or state) 310, a decision step (or state) 312, a step (or state) 314, a step (or state) 316, a step (or state) 318, a step (or state) 320, and a step (or state) 322.

The state 302 starts the method 300. Next, the decision state 304 determines whether a program operation has been issued. If so, the method 300 moves to the state 308. If not, the method 300 moves to the state 306, which ends the method 300. The state 308 issues a polling status command. Next, the state 310 reports an error count. Next, the method 300 moves to the decision state 312.

The decision state 312 determines if the number of errors is above a threshold. If not, the method 300 moves to the state 314. The state 314 allows the controller 70 to tolerate the measured error count. Next, the state 316 reports a success of the programming. The method 300 then ends at the state 306. If the decision state 312 determines the number of errors is above the threshold, the method 300 moves to the state 318. The state 318 reprograms data to another location. Next, the state 320 reports a failure of the programming. The state 322 ends the method 300.

Figure 7:
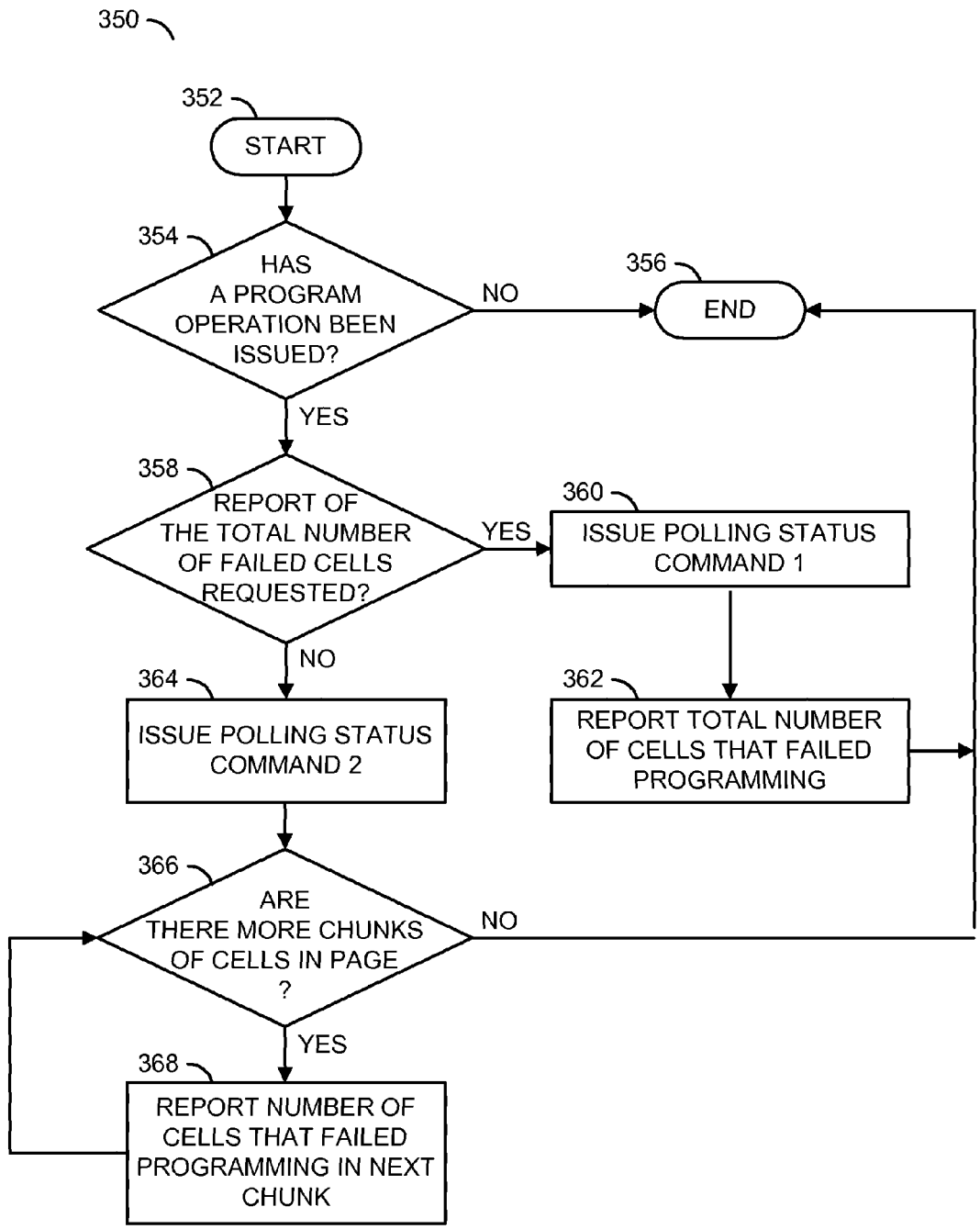
FIG. 7 is a flow diagram illustrating issuing polling status commands.

Referring to FIG. 7, a flow diagram illustrating a method (or process) 350 is shown. The method 350 may implement issuing polling status commands. The method 350 generally comprises a step (or state) 352, a decision step (or state) 354, a step (or state) 356, a decision step (or state) 358, a step (or state) 360, a step (or state) 362, a step (or state) 364, a decision step (or state) 366, and a step (or state) 368. The step 352 starts the method 350. The decision state 354 determines if a program operation has been issued. If not, the method 350 moves to the state 356, which ends the method 350. If so, the method 350 moves to the decision state 358.

The decision state 358 determines whether a report of the total number of failed cells is requested. If so, the method 350 moves to the state 360. The state 360 issues a polling status command number 1. Next, the state 362 reports the total number of cells that failed programming. The method then ends at the state 356. If the decision state 358 determines a report of the total number of failed cells is not requested, the method 350 moves to the state 364. The state 364 issues a polling status command number 2. Next, the decision state 366 determines if there are more chunks of cells in a page. If not, the method 350 moves to the state 356 which ends the method 350. If so, the method 350 moves to the state 368. The state 368 reports the number of cells that failed programming in the next chunk. The method 350 then returns to the decision state 366.

Figure 8:
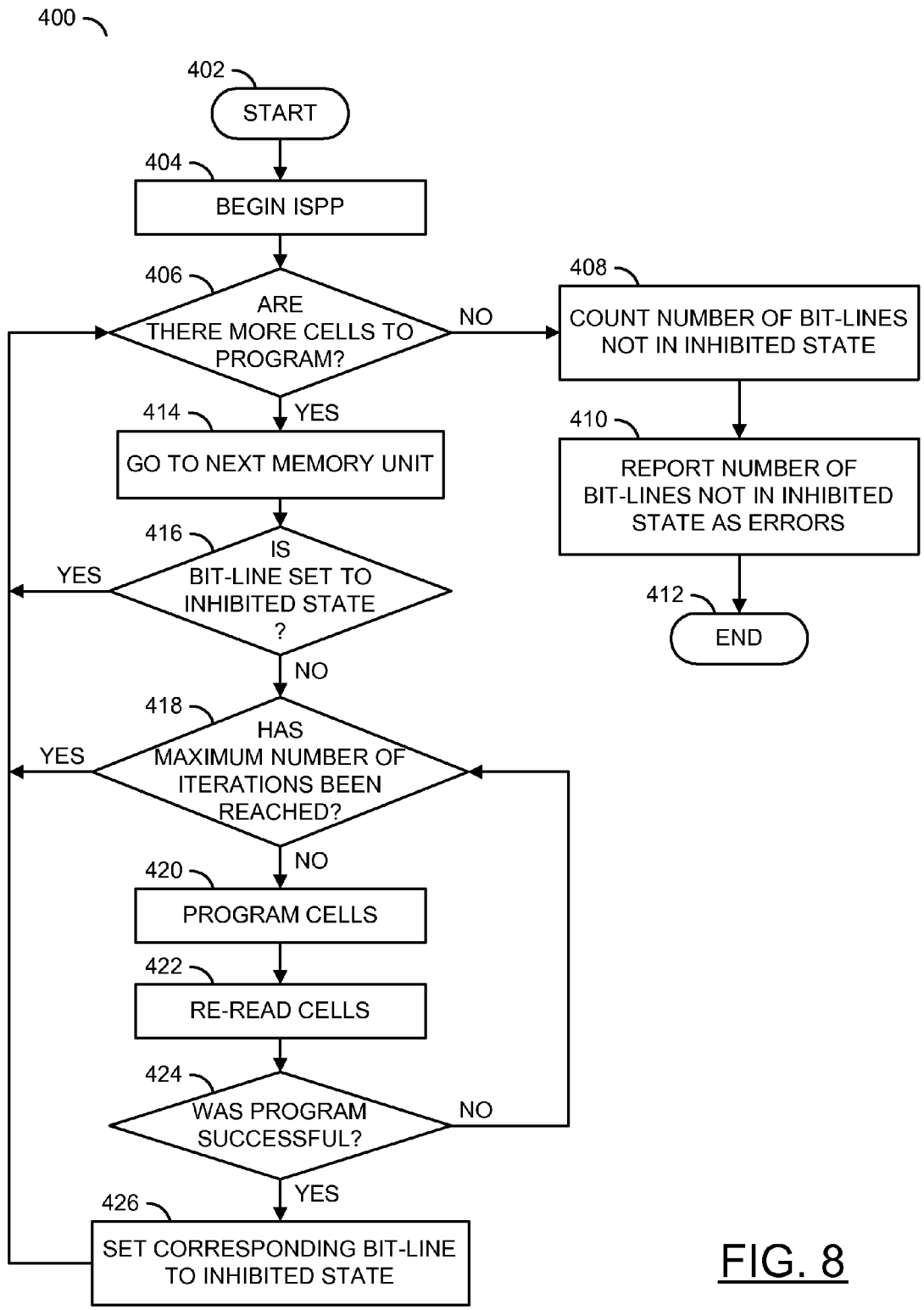
FIG. 8 is a flow diagram illustrating reporting a number of cells that fail programming using a single buffer.

Referring to FIG. 8, a flow diagram illustrating a method (or process) 400 is shown. The method 400 may implement reporting a number of cells that fail programming using a single buffer. The method 400 generally comprises a step (or state) 402, a step (or state) 404, a decision step (or state) 406, a step (or state) 408, a step (or state) 410, a step (or state) 412, a step (or state) 414, a decision step (or state) 416, a decision step (or state) 418, a step (or state) 420, a step (or state) 422, a decision step (or state) 424, and a step (or state) 426.

The state 402 may start the method 400. The state 404 may begin ISPP. Next, the method 400 moves to the decision state 406. If the decision state 406 determines there are not more cells to program, the method 400 moves to the state 408. The state 408 may count a number of bit-lines not in an inhibited state. Next, the state 410 may report the number of bit-lines not in the inhibited state as errors. Next, the method 400 moves to the state 412, which ends the method 400. If the decision state 406 determines there are more cells to program, the method 400 moves to the state 414. The state 414 may go to the next memory unit. Next, the method 400 moves to the decision state 416.

If the decision state 416 determines the bit-line is set to the inhibited state, the method 400 returns to the decision state 406. If not, the method 400 moves to the decision state 418. If the decision state 418 determines the maximum number of iterations has been reached, the method 400 returns to the decision state 406. If not, the method 400 moves to the state 420.

The state 420 may program the cells (e.g., the program stage of ISPP). The state 422 may re-read the cells (e.g., the verify stage of ISPP). Next, the method 400 moves to the decision state 424. If the decision state 424 determines the program was not successful, the method 400 returns to the decision state 418. If the decision state 424 determines the program was successful, the method 400 moves to the state 426. The state 426 may set the corresponding bit-line to the inhibited state. Next, the method 400 returns to the decision state 406.

In some embodiments, ISPP may be implemented with a single write data buffer (e.g., the write buffer 86a). One bit buffer may correspond to one bit-line (e.g., an all bit-line architecture), or one bit buffer may be shared between two neighbor bit-lines (e.g., an even/odd architecture). During ISPP, the flash memory 80 may program the flash cells. The flash cells in a memory unit may be programmed simultaneously (e.g., the flash cells in a page may be programmed simultaneously). After programming the flash cells, the flash memory 80 may re-read the flash cells. If the programming is successful (e.g., the cell voltage is greater than the target voltage), data stored in the write buffer 86a will be changed to an inhibited state. For example with SLC memory, the write bit may be set to a logical 1. In another example with MLC memory, the write bit may be set to a logical 11.

Cells on corresponding bit-lines having an inhibited state in the write buffer 86a may not be programmed. If a program operation is unsuccessful, the cells on corresponding bit-lines may not have an inhibited state in the write buffer 86a. Cells not having corresponding bit-lines with an inhibited state may be reprogrammed (e.g., another iteration of ISPP may be performed).

After ISPP is completed, the number of bit-lines in an inhibited state in the write buffer 86a may be counted. For example, if a program operation is completed successfully (e.g., no cells have failed programming), then all bit-lines in the write buffer 86a may be inhibited. In another example, if there are some bit-lines not in an inhibited state, then some cells may not be sufficiently programmed (e.g., there was a program failure). For example, if the data value in the sense amplifier of each bit-line is not logical 1 for SLC memory or not logical 11 for MLC memory, then there may be a programming error.

The number of bit-lines not in the inhibited state in the write buffer 86a may correspond to the number of programming errors. A count of the number of bit-lines in the write buffer 86*a* that are not in the inhibited state after ISPP is completed may report the number of errors. Counting the number of bit-lines may be performed per physical flash page and/or per chunk (e.g., codeword and/or fragment of a flash page). For example, the count of the number of bit-lines in the write buffer 86*a* may be performed on a chunk of memory when there are 8 and/or 16 codewords per flash page.

Once the flash controller 70 knows the error count due to program failure(s) and/or the error count in a chunk of cells inside a page, the controller 70 may make a decision on the next steps to perform (e.g., steps to ensure data integrity). In one example where the error count is high (e.g., above an error correction capability of ECC), the controller 70 may reprogram data in other locations. In another example where the error count is low (e.g., below an error correction capability of ECC), the controller 70 may tolerate the errors.

The controller 70 may implement various polling status commands. In some embodiments, the controller 70 may implement the polling status command number 1. The polling status command number 1 may report the total number of failed cells of one page. For example, the controller 70 may issue the polling status command number 1 after a program operation and the flash memory circuit 80 may report the total number of cells that failed to be programmed in a current page.

In some embodiments, the controller 70 may implement the polling status command number 2. The polling status command number 2 may report the total number of failed cells of each chunk of cells inside a page. For example, the flash controller 70 may issue the polling status command number 2 after a program operation and the flash memory circuit 80 may report the total number of cells that failed to be programmed in each chunk of a page.

A flash page may be divided into codewords. A chunk of a page may be a codeword. For example, a 16 k byte flash page may be divided into 8 codewords where each codeword may be 2 k bytes and each codeword corresponds to 16 k cells. When the controller 70 issues the polling status command number 2, the flash memory 80 may report the total number of cells that fail programming in each 16 k section of cells (e.g., the number of cells that failed programming in a codeword/chunk).

In some embodiments, the controller 70 may implement the polling status command number 1 and/or the polling status command number 2. By issuing the polling status command(s), the flash controller 70 may be presented with the cell failure count just by status polling (e.g., without issuing a read command). Status polling may be faster (e.g., by orders of magnitude) than reading a whole page that was programmed and comparing the read data with the original data sent to be programmed.

The total number of failed cells reported by implementing the polling status command may provide the flash controller 70 with sufficient information to determine efficient data management procedures. For example, the controller 70 may determine whether to reprogram data to other locations (e.g., locations that are known to be reliable). In another example, the controller 70 may determine whether or not to keep the existing programmed data.

In some embodiments, the controller 70 may adjust a refresh frequency of the cells in locations having a tolerable error count. The refresh frequency may be increased to ensure that the total number of errors is within the error correction capability of ECC. For example, for a location having a high number of program errors, increasing the refresh frequency may lower the number of errors at the end of the refresh period. The total number of errors may be the sum of the program errors, other errors, and/or retention errors. Increasing the refresh frequency may control the number of retention errors. Increasing the refresh frequency may allow a block and/or flash page to still be usable. Since the flash controller 70 implements ECC capable of correcting a number of errors, one or just a few cells that fail programming may be tolerable.

The functions performed by the diagrams of FIGS. 3 and 5-8 may be implemented using one or more of a conventional general purpose processor, digital computer, microprocessor, microcontroller, RISC (reduced instruction set computer) processor, CISC (complex instruction set computer) processor, SIMD (single instruction multiple data) processor, signal processor, central processing unit (CPU), arithmetic logic unit (ALU), video digital signal processor (VDSP) and/or similar computational machines, programmed according to the teachings of the specification, as will be apparent to those skilled in the relevant art(s). Appropriate software, firmware, coding, routines, instructions, opcodes, microcode, and/or program modules may readily be prepared by skilled programmers based on the teachings of the disclosure, as will also be apparent to those skilled in the relevant art(s). The software is generally executed from a medium or several media by one or more of the processors of the machine implementation.

The invention may also be implemented by the preparation of ASICs (application specific integrated circuits), Platform ASICs, FPGAs (field programmable gate arrays), PLDs (programmable logic devices), CPLDs (complex programmable logic devices), sea-of-gates, RFICs (radio frequency integrated circuits), ASSPs (application specific standard products), one or more monolithic integrated circuits, one or more chips or die arranged as flip-chip modules and/or multi-chip modules or by interconnecting an appropriate network of conventional component circuits, as is described herein, modifications of which will be readily apparent to those skilled in the art(s).

The invention thus may also include a computer product which may be a storage medium or media and/or a transmission medium or media including instructions which may be used to program a machine to perform one or more processes or methods in accordance with the invention. Execution of instructions contained in the computer product by the machine, along with operations of surrounding circuitry, may transform input data into one or more files on the storage medium and/or one or more output signals representative of a physical object or substance, such as an audio and/or visual depiction. The storage medium may include, but is not limited to, any type of disk including floppy disk, hard drive, magnetic disk, optical disk, CD-ROM, DVD and magneto-optical disks and circuits such as ROMs (read-only memories), RAMS (random access memories), EPROMs (erasable programmable ROMs), EEPROMs (electrically erasable programmable ROMs), UVPROM (ultra-violet erasable programmable ROMs), Flash memory, magnetic cards, optical cards, and/or any type of media suitable for storing electronic instructions.

The elements of the invention may form part or all of one or more devices, units, components, systems, machines and/or apparatuses. The devices may include, but are not limited to, servers, workstations, storage array controllers, storage systems, personal computers, laptop computers, notebook computers, palm computers, personal digital assistants, portable electronic devices, battery powered devices, set-top boxes, encoders, decoders, transcoders, compressors, decompressors, pre-processors, post-processors, transmitters, receivers, transceivers, cipher circuits, cellular telephones, digital cameras, positioning and/or navigation systems, medical equipment, heads-up displays, wireless devices, audio recording, audio storage and/or audio playback devices, video recording, video storage and/or video playback devices, game platforms, peripherals and/or multi-chip modules. Those skilled in the relevant art(s) would understand that the elements of the invention may be implemented in other types of devices to meet the criteria of a particular application.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
   a memory configured to store data, the memory comprising a verify/read buffer, a write buffer and a plurality of memory dies, wherein
      each memory die has a size less than a total size of the memory and includes a plurality of cells,
      the memory is configured to perform a program operation to write to and verify one or more of the plurality of cells in response to receiving a program command, and
      the memory is configured to determine and report a number of the cells that failed to be verified during the program operation in response to receiving a polling status command; and
   a controller configured to issue the program command to program the plurality of memory dies and to issue the polling status command after issuing the program command to obtain the number of the cells that failed to be verified during the program operation, wherein
      the controller is configured to issue the polling status command having either a first mode configured to request the memory report a total number of the cells that failed to be programmed in the memory die or a second mode configured to request the memory report the total number of the cells that failed to be programmed in a chunk of the memory die, and
      in response to the mode of the polling status command received from the controller, the memory is configured to determine the number of the cells that failed to be verified in the requested portion of the memory die using data to be programmed during the program operation, which is stored in the write buffer, and verify data that was stored in the verify/read buffer during a verification portion of the program operation to avoid triggering a read of an entire page of the memory by the controller.

2. The apparatus according to claim 1, wherein in response to the polling status command, the memory performs a comparison of data stored in the write buffer to data stored in the verify/read buffer during the verification portion of the program operation.

3. The apparatus according to claim 2, wherein the comparison is a bit by bit comparison.

4. The apparatus according to claim 2, wherein the write buffer and the verify/read buffer are implemented in the memory.

5. The apparatus according to claim 1, wherein the chunk of the memory die is a codeword.

6. The apparatus according to claim 1, wherein the polling status command comprises a flash command issued by the controller.

7. The apparatus according to claim 1, wherein the controller is further configured to determine if the number of the cells that failed to be verified is above a threshold value.

8. The apparatus according to claim 7, wherein the threshold value is an error correcting capability of an error correcting code.

9. The apparatus according to claim 7, wherein the controller is further configured to re-program data to be stored during the program operation to another location in the memory if the number of the cells that failed to be verified is above the threshold value.

10. The apparatus according to claim 7, wherein the controller is further configured to adjust a refresh frequency of the memory dies if the number of the cells that failed to be verified is above the threshold value.

11. The apparatus according to claim 7, wherein the controller is further configured to tolerate the number of the cells that failed to be programmed if the number of the cells that failed to be verified is below the threshold value.

12. The apparatus according to claim 1, wherein the apparatus comprises a solid state drive (SSD).

13. The apparatus according to claim 1, wherein the controller comprises an erase/program unit configured to implement a redundancy scheme combining a number of blocks from a number of the plurality of memory dies as a redundancy block for erase and program operations.

14. The apparatus according to claim 1, wherein the controller and the memory are implemented as two or more integrated circuits.

15. The apparatus according to claim 1, wherein the memory further comprises a comparator circuit coupled to the write buffer and the verify/read buffer, the comparator circuit configured to determine, in response to the memory receiving the polling status command from the controller, the number of the cells in the requested portion of the memory die that failed to be verified during the program operation by performing a bit by bit comparison of the data that was to be programmed, which is stored in the write buffer, and the verify data, which is stored in the verify/read buffer.

16. A method of reporting a count of cell program failures, comprising the steps of:
   configuring a memory to store data, the memory comprising a verify/read buffer, a write buffer and a plurality of memory dies, wherein
      each memory die has a size less than a total size of the memory and includes a plurality of cells,
      the memory is configured to perform a program operation to write to and verify one or more of the plurality of cells in response to receiving a program command, and
      the memory is configured to determine and report a number of the cells that failed to be verified during the program operation in response to receiving a polling status command;

issuing the program command from a controller to the memory for the program operation to write to and verify one or more of the cells; and issuing the polling status command from the controller to the memory after the program command to obtain the number of the cells that failed to be verified during the program operation, wherein in a first mode, the polling status command is configured to request the memory report a total number of the cells that failed to be programmed in the memory die, in a second mode, the polling status command is configured to request the memory report the total number of the cells that failed to be programmed in a chunk of the memory die, and in response to the mode of the polling status command, the memory determines the number of the cells that failed to be verified in the requested portion of the memory die using data to be programmed during the program operation, which is stored in the write buffer, and verify data that was stored in the verify/read buffer during a verification portion of the program operation to avoid triggering a read of an entire page of the memory by a controller.

17. The method according to claim 16, wherein the chunk of the memory die is a codeword.

18. An apparatus comprising:

an interface configured to process a plurality of read/program operations to/from a memory comprising a verify/read buffer, a write buffer and a plurality of memory dies; and a control circuit configured to (i) issue a program command to the memory for a program operation to write to and verify one or more cells of the memory, and (ii) issue a polling status command to the memory after the program command to obtain a number of the cells that failed to be verified during the program operation, wherein the control circuit is configured to issue the polling status command in a first mode to request the memory report a total number of the cells that failed to be programmed in the memory die, the control circuit is configured to issue the polling status command in a second mode configured to request the memory report the total number of the cells that failed to be programmed in a chunk of the memory die, and in response to the mode of the polling status command received from the control circuit, the memory is configured to determine and report the number of the cells that failed to be verified in the requested portion of the memory die and the number of the cells that failed to be verified is determined by the memory using data to be programmed during the program operation, which is stored in the write buffer, and verify data that was stored in the verify/read buffer of the memory during a verification portion of the program operation to avoid triggering a read of an entire page of the memory by the control circuit.

19. The apparatus according to claim 18, wherein the apparatus comprises a solid state drive (SSD) controller.

20. The apparatus according to claim 18, wherein the chunk of the memory die is a codeword.

* * * * *